(12) United States Patent
Ishikawa

(10) Patent No.: US 9,419,605 B2
(45) Date of Patent: Aug. 16, 2016

(54) COMPOSITE SEMICONDUCTOR SWITCHING DEVICE

(75) Inventor: Junichiro Ishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 142 days.

(21) Appl. No.: 14/390,536

(22) PCT Filed: Apr. 6, 2012

(86) PCT No.: PCT/JP2012/002413
§ 371 (c)(1),
(2), (4) Date: Nov. 11, 2014

(87) PCT Pub. No.: WO2013/150567
PCT Pub. Date: Oct. 10, 2013

(65) Prior Publication Data
US 2015/0116024 A1    Apr. 30, 2015

(51) Int. Cl.
*H03K 17/16* (2006.01)
*H03K 17/56* (2006.01)
*H02M 1/088* (2006.01)
(Continued)

(52) U.S. Cl.
CPC ............ *H03K 17/56* (2013.01); *H02M 1/08* (2013.01); *H02M 1/088* (2013.01); *H03K 17/164* (2013.01); *H02M 2001/0054* (2013.01); *H03K 2217/0036* (2013.01); *H03K 2217/0054* (2013.01); *Y02B 70/1491* (2013.01)

(58) Field of Classification Search
CPC ............. H03K 17/56; H03K 17/164; H03K 2217/0054; H03K 2217/0036; H02M 1/08; H02M 1/088; H02M 2001/0054; H02B 70/1491

USPC .......................................................... 327/365
See application file for complete search history.

(56) References Cited

U.S. PATENT DOCUMENTS 4,366,522 A * 12/1982 Baker ................. H03K 17/567
                                                    323/272
4,829,200 A *  5/1989 Downey .......... H03K 19/09448
                                                    257/337
(Continued)

FOREIGN PATENT DOCUMENTS

JP       57 39144      2/1980
JP       59 111332     7/1984
(Continued)

OTHER PUBLICATIONS

International Search Report Issued May 15, 2012 in PCT/JP12/002413 Filed Apr. 6, 2012.

*Primary Examiner* — Kenneth B Wells
(74) *Attorney, Agent, or Firm* — Oblon, McClelland, Maier & Neustadt, L.L.P

(57) ABSTRACT

A composite semiconductor switching device includes: a first semiconductor element that incurs switching losses when performing switching operation of turning on and off; a second semiconductor element that is parallelly connected to the first semiconductor element and incurs switching losses larger than the first semiconductor element when performing switching operations of turning on and off; and a controller that operates in order of giving a first on-command signal to the first semiconductor element, giving a second on-command signal to the second semiconductor element, deactivating the first on-command signal, giving a third on-command signal to the first semiconductor element, and deactivating the second on-command signal.

4 Claims, 2 Drawing Sheets

(51) Int. Cl.
*H02M 1/08* (2006.01)
*H02M 1/00* (2006.01)

(56) References Cited

U.S. PATENT DOCUMENTS

| | | | | | |
|---|---|---|---|---|---|
| 5,030,844 | A | * | 7/1991 | Li | H02H 9/001 307/115 |
| 5,610,507 | A | * | 3/1997 | Brittan | H03K 17/122 323/272 |
| 5,689,197 | A | * | 11/1997 | Sugawara | H01L 27/0623 257/E27.015 |
| 5,757,052 | A | * | 5/1998 | Manning | H01L 27/0623 257/378 |
| 5,834,814 | A | * | 11/1998 | Ito | H01L 27/0722 257/378 |
| 5,963,469 | A | * | 10/1999 | Forbes | G11C 11/404 257/302 |
| 6,084,461 | A | * | 7/2000 | Colbeth | H03F 1/223 327/362 |
| 6,317,357 | B1 | * | 11/2001 | Forbes | G11C 11/404 257/302 |
| 7,830,196 | B2 | * | 11/2010 | Omaru | H01L 27/0248 327/309 |
| 8,400,123 | B2 | * | 3/2013 | Deboy | H02M 3/1584 323/222 |
| 9,041,456 | B2 | * | 5/2015 | Hasegawa | H03K 17/12 327/108 |

FOREIGN PATENT DOCUMENTS

| | | |
|---|---|---|
| JP | 59 167119 | 9/1984 |
| JP | 61 72411 | 4/1986 |
| JP | 61 107813 | 5/1986 |
| JP | 5 90933 | 4/1993 |
| JP | 6 90151 | 3/1994 |
| JP | 6 141542 | 5/1994 |
| JP | 6 311744 | 11/1994 |
| JP | 7 322600 | 12/1995 |
| JP | 2002 16486 | 1/2002 |
| JP | 2002 208849 | 7/2002 |
| JP | 2006 344779 | 12/2006 |
| JP | 2008 79475 | 4/2008 |

* cited by examiner

COMPOSITE SEMICONDUCTOR SWITCHING DEVICE

TECHNICAL FIELD

The present invention relates to a composite semiconductor switching device.

BACKGROUND ART

A conventional composite semiconductor switching device is configured, as described in Patent Document 1 listed below, so that a metal oxide semiconductor field effect transistor and an insulated gate bipolar transistor are parallelly connected in a switch circuit performing power conversion by switching operations, and the metal oxide semiconductor field effect transistor has a gate threshold voltage lower than a gate threshold voltage of the insulated gate bipolar transistor. That is, by parallelly connecting the IGBT and the MOSFET, a small current flows through the MOSFET having a saturation voltage lower than the IGBT, an intermediate current flows through both of the IGBT and the MOSFET, and a large current flows through the IGBT having a saturation voltage lower than the MOSFET. According to the composite semiconductor switching device, its turn-on saturation voltage is that of the MOSFET in a small current range, and is that of the IGBT in a large current range; therefore, in a whole current range, the composite semiconductor switching device has a saturation voltage lower than those of the MOSFET component and the IGBT component to have a smaller on-state loss, thereby being improved in a conversion efficiency.

Another conventional composite semiconductor switching device includes, as described in Patent Document 2 listed below, switching transistors connected in parallel for providing a current to a load, and a pulse generator providing, in response to said current, pulse width modulated pulse cycles each of which has a pulse signal, and an alternate selector controlling, in each pulse cycle, a predetermined transistor to turn ON prior to the other transistors, thereby dissipating all the turn ON losses, and controlling a predetermined transistor to turn OFF later than other transistors, thereby dissipating all the turn OFF losses.

In the composite semiconductor switching device mentioned above, the switching loss can be equally assigned to the parallelly connected MOSFET transistors.

PRIOR ART DOCUMENT

Patent Document

Patent Document 1: Japanese Patent Laid-Open Publication No. H05-90933
Patent Document 2: Japanese Patent Laid-Open Publication No. H06-90151

DISCLOSURE OF INVENTION

Problem to be Solved by the Invention

A composite semiconductor switching device in Patent Document 1 listed above relates to a technique in which the semiconductor elements' switching losses are assigned to the MOSFET and the IGBT according to their gate threshold voltages; a composite semiconductor switching device in Patent Document 2 listed above relates to a technique in which switching losses occurring when turned on and off are equally assigned to the transistors. On the other hand, because semiconductor elements have a switching loss and a steady state loss, a problem has been found that if the two power losses differ between a first semiconductor element and a second semiconductor element included in the composite semiconductor switching device, the switching loss and the steady state loss are not suitably assigned to the respective semiconductor elements according to their power loss characteristics.

The present invention is made to solve the problem described above and has an aim to provide a composite semiconductor switching device in which first and second semiconductor elements having differences in their switching loss characteristics are parallelly connected to be given control command signals according to the power loss characteristics of the first and second semiconductor elements.

Means for Solving Problem

A composite semiconductor switching device according to a first aspect of the invention includes: a first semiconductor element that incurs switching losses when performing switching operation of turning on and off; a second semiconductor element that is parallelly connected to the first semiconductor element and incurs switching losses larger than the first semiconductor element when performing switching operations of turning on and off; and a control means that operates in order of giving a first on-command signal to the first semiconductor element, giving a second on-command signal to the second semiconductor element, deactivating the first on-command signal, giving a third on-command signal to the first semiconductor element, and deactivating the second on-command signal. According to the composite semiconductor switching device, the control means operates in order of giving the first on-command signal to the first semiconductor element to turn on the first semiconductor element, giving the second on-command signal to the second semiconductor element, deactivating the first on-command signal, giving the third on-command signal to the first semiconductor element, and deactivating the second on-command signal. This causes the first semiconductor element to incur only the turn-on and -off losses and causes the second semiconductor element to incur the steady state loss, which makes it possible that power loss is suitably assigned to the respective semiconductor elements according to their switching loss characteristics.

In a composite semiconductor switching device according to a second aspect of the invention, it is preferable that the control means generates the first and second on-command signals so that after the second on-command signal builds up, a period overlapping between the second on-command signal and the first on-command signal is a turn-on time of the second semiconductor element or longer, but is twice the turn-on time or shorter. This can reduce a steady state power loss of the first semiconductor element, because the first semiconductor element is rapidly turned off after the second semiconductor element completely turns on in a condition that the first semiconductor element turns on.

In a composite semiconductor switching device according to a third aspect of the invention, it is preferable that the control means generates the second and third on-command signals so that after the third on-command signal builds up, a period overlapping between the third on-command signal and the second on-command signal is a turn-off time of the second semiconductor element or longer, but is twice the turn-off time or shorter. This can reduce the steady state power loss of the first semiconductor element, because the first semiconductor element is rapidly turned off in the conduction state after the second semiconductor element turns off. Furthermore, by combining the composite semiconductor switching devices according to the second and third aspects of the invention, it is possible that almost all of the turn-on and -off losses are assigned to the first semiconductor element, and almost all the steady state loss is assigned to the second semiconductor element. Therefore, the turn-on and -off losses and the steady state loss can be suitably assigned to the first semiconductor element and the second semiconductor element, respectively.

Effect of the Invention

In a composite semiconductor switching device according to the present invention, first and second semiconductor elements having differences in their switching loss characteristics are parallelly connected, and the power loss characteristics of the first and second semiconductor elements are taken into account to give first and second control command signals to the first and second semiconductor elements, respectively. This enables us to obtain a composite semiconductor switching device in which the switching loss is suitably assigned to the first and second semiconductor elements.

Figure 1:
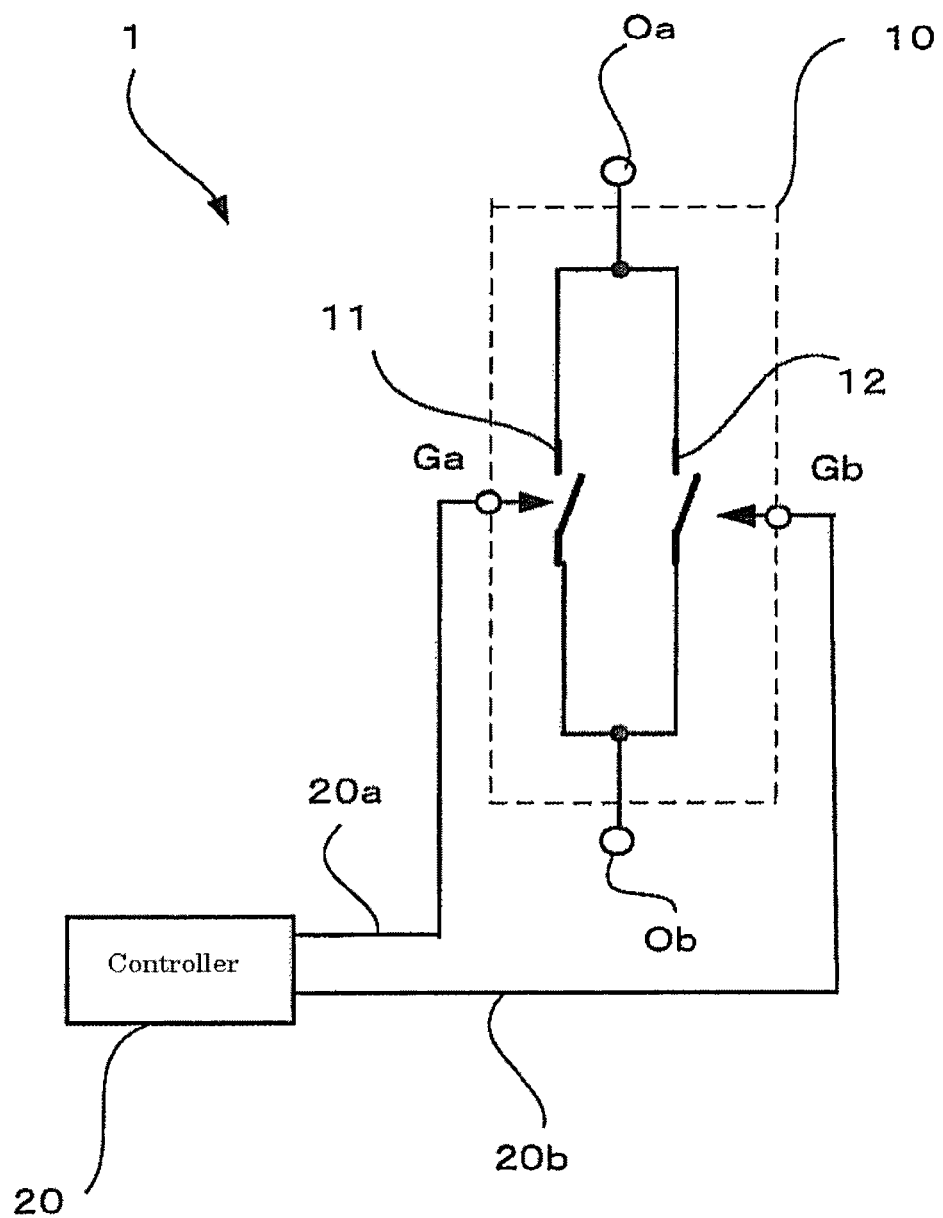
FIG. 1 is a general view of a composite semiconductor switching device representing an embodiment of the present invention.

Numeral Explanation 1 composite semiconductor switching device
11 first semiconductor element
12 second semiconductor element
20 controller
20a first control command signal
20b second control command signal

BEST MODE FOR CARRYING OUT THE INVENTION

Embodiment 1

Figure 2:
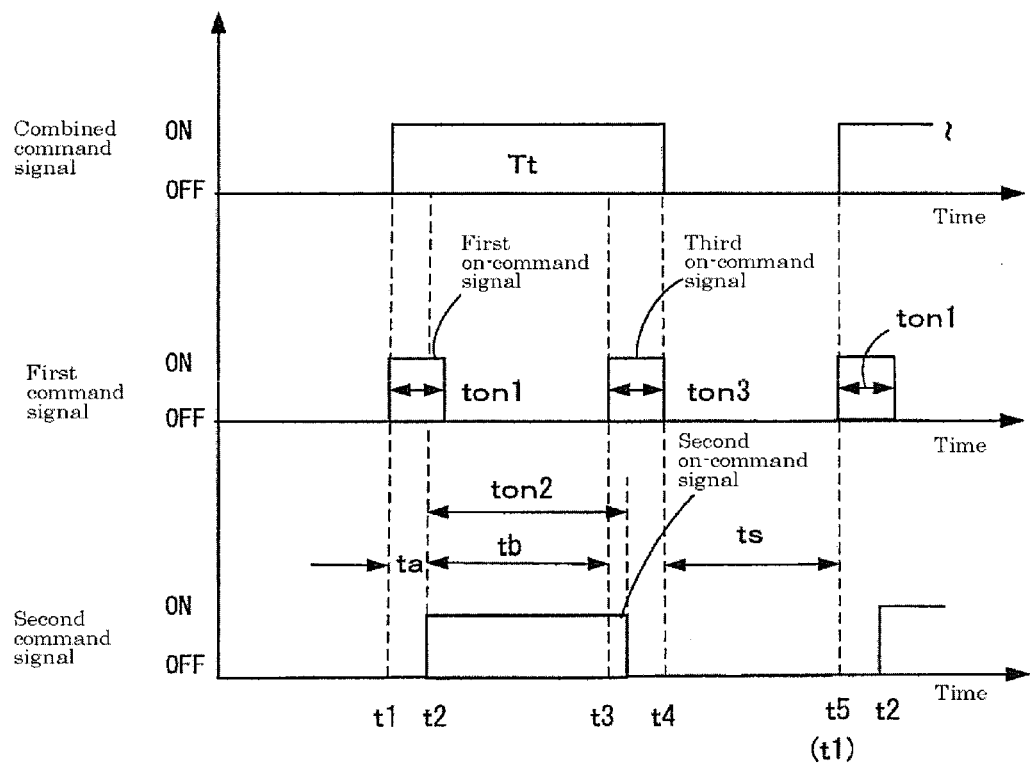
FIG. 2 is a time chart showing operations of the composite semiconductor switching device shown in FIG. 1.

An embodiment of the present invention will be explained using FIG. 1 and FIG. 2. FIG. 1 is a general view of a composite semiconductor switching device representing the embodiment of the present invention; FIG. 2 is a time chart showing operations of the composite semiconductor switching device shown in FIG. 1. FIG. 1 shows that the composite semiconductor switching device 1 includes a semiconductor switching unit 10 having switchable semiconductor elements, and a controller 20 generating control command signals for the semiconductor switching unit 10. The semiconductor switching unit 10 includes a first semiconductor element 11 which consists of an SiC MOSFET, and a second semiconductor element 12 which is parallelly connected to the first semiconductor element 11 and consists of an Si IGBT having a switching loss larger than the first semiconductor element. The semiconductor switching unit 10 further includes a first gate terminal Ga for driving the first semiconductor element 11, a second gate terminal Gb for driving the second semiconductor element 12, and two output terminals Oa and Ob. Here, in comparison to the second semiconductor element 12, the first semiconductor element 11 has properties of a smaller loss and a higher switching speed, but has a disadvantage of a higher cost.

The controller 20 is configured so as to generate a first control command signal 20a for driving the first semiconductor element 11 and so as to generate a second control command signal 20b for driving the second semiconductor element 12. As shown in FIG. 2, the first control command signal 20a is configured so as to give a first on-command signal from a reference time t1 during a period slightly longer than the turn-on time of the first semiconductor element 11, i.e. during a first predetermined period ton1; the second control command signal 20b is configured so as to generate a second on-command signal during a second predetermined period ton2 from a time t2 which is delayed by a period ta from the reference time t1. Here, while the first on-command signal is being generated, the first on-command signal and the second on-command signal are overlapped for a slight period from the second on-command signal's build-up. This is aimed at preventing the second semiconductor element 12 from incurring a turn-on switching loss, by turning on the second semiconductor element 12 while the first semiconductor element 11 is in on-state.

The controller 20 is configured so that a third on-command signal is generated at a time t3, i.e. an instance when a period tb slightly shorter than the period ton2 elapses from the time t2, to be kept generated for a third predetermined period ton3, and then is deactivated at a time t4. Here, immediately before the second on-command signal is terminated, the third on-command signal and the second on-command signal are overlapped for a slight period. This is aimed at preventing the second semiconductor element 12 from incurring a turn-off switching loss, by turning off the second semiconductor element 12 while the first semiconductor element 11 is in on-state.

Next, the controller 20 is configured so that off-commands being the first and second control command signals are generated from the time t4 for a period is for turning off the first and second semiconductor elements 11 and 12. As described above, the controller 20 generates the first and second control command signals in a cycle from the time t1 to a time t5, in which the first on-command signal is generated from the time t1 for the first predetermined period ton1, the second on-command signal is generated from the time t2 for the second predetermined period ton2, the third on-command signal is generated from the time t3 for the third predetermined period ton3, and then the first and second control command signals are in a state of OFF at the time t4. Then, the controller starts the next cycle at the time t5 (t1).

Explanation will be made about the operation of the composite semiconductor switching device described above, using FIG. 1 and FIG. 2. The controller 20 inputs the first on-command signal into the first gate terminal Ga of the first semiconductor element 11 in the semiconductor switching unit 10 from the reference time t1 for the first predetermined period ton1, thereby turning on the first semiconductor element 11 to supply a current to a load (not shown in the figure). The controller 20 inputs the second on-command signal into the second gate terminal Gb from the time t2, i.e. the instance when the period ta elapses from the reference time t1, for the second predetermined period ton2, so that the second semiconductor element 12 turns on in a condition that the first semiconductor element 11 completely turns on. After an elapse of a slight period from the time t2, the first on-command signal is deactivated to turn off the first semiconductor element 11, so that only the second semiconductor element 12 turns on for a while to supply the current to the load (not shown in the figure).

Here, it is preferable that the controller 20 generates the first and second on-command signals so that after the on-command signal builds up at the time t2, a period overlapping with the first on-command signal is a turn-on time of the second semiconductor element 12 or longer, but is twice the turn-on time or shorter. This is because a steady state power loss of the first semiconductor element 11 can be reduced by rapidly turning off the first semiconductor element 11 after the second semiconductor element 12 completely turns on.

From the time t3, i.e. an instance when the period tb slightly shorter than the second predetermined period ton2 elapses from the time t2, the controller 20 generates the third on-command signal for the third predetermined period ton3 to turn on the first semiconductor element 11. After an elapse of a slight period from the time t3, the second on-command signal is deactivated to turn off the second semiconductor element 12, so that only the first semiconductor element 11 is turned on for a while to flow the current to the load (not shown in the figure). Here, it is preferable that the controller 20 generates the second and third on-command signals so that after the third on-command signal builds up at the time t3, a period overlapping with the second on-command signal is a turn-off time of the second semiconductor element 12 or longer, but is twice the turn-off time or shorter. This is because the steady state power loss of the first semiconductor element 11 can be reduced by rapidly turning off the first semiconductor element 11 in its conduction state after the second semiconductor element 12 turns off.

Next, the third on-command signal generated from the controller 20 is deactivated at the time t4, and the controller 20 inputs, from the time t4 for a fourth predetermined period ts, first and second off-command signals into the first gate terminal Ga and second gate terminal Gb, respectively, to keep the first and second semiconductor elements 11 and 12 turning off. As described above, a period from the time t1 to the time t5 is a cycle for the first and second control command signals 20*a* and 20*b* serving as control command signals, which are repeated at this cycle to drive the semiconductor switching unit 10.

The composite semiconductor switching device of the embodiment described above includes: a first semiconductor element 11 that is capable of performing switching operation to turn on and off; a second semiconductor element 12 that is parallelly connected to the first semiconductor element 11 and is capable of performing switching operation to turn on. and off with a switching loss larger than the first semiconductor element 11; and a controller 20 that operates in order of giving a first on-command signal to the first semiconductor element 11, giving a second on-command signal to the second semiconductor element 12, deactivating the first on-command signal, giving a third on-command signal to the first semiconductor element 11, and deactivating the second on-command signal.

In the composite semiconductor switching device 1, the second semiconductor element 12 is provided which is parallelly connected to the first semiconductor element 11 and has a switching loss larger than the first semiconductor element 11, and the controller 20 turns on and off the first semiconductor element 11, and makes the second semiconductor element 12 conduct electricity from an on-time to an off-time. This causes the first semiconductor element 11 to incur only the turn-on and -off losses and causes the second semiconductor element 12 to incur the steady state loss, which makes it possible that loss is assigned to the respective semiconductor elements 11 and 12 according to the switching losses. This technique can reduce the power loss rating of the first semiconductor element 11.

INDUSTRIAL APPLICABILITY

The present invention is applicable to a composite semiconductor switching device.

The invention claimed is:
1. A composite semiconductor switching device comprising:
 a first semiconductor element that incurs switching losses when performing switching operation of turning on and off;
 a second semiconductor element that is parallelly connected to the first semiconductor element and incurs switching losses larger than the first semiconductor element when performing switching operations of turning on and off; and
 a control means that operates in order of giving a first on-command signal to the first semiconductor element, giving a second on-command signal to the second semiconductor element, deactivating the first on-command signal, giving a third on-command signal to the first semiconductor element, and deactivating the second on-command signal.
2. The composite semiconductor switching device according to claim 1, wherein the control means generates the first and second on-command signals so that after the second on-command signal builds up, a period overlapping between the second on-command signal and the first on-command signal is a turn-on time of the second semiconductor element or longer, but is twice the turn-on time or shorter.
3. The composite semiconductor switching device according to claim 1, wherein the control means generates the second and third on-command signals so that after the third on-command signal builds up, a period overlapping between the third on-command signal and the second on-command signal is a turn-off time of the second semiconductor element or longer, but is twice the turn-off time or shorter.
4. The composite semiconductor switching device according to claim 2, wherein the control means generates the second and third on-command signals so that after the third on-command signal builds up, a period overlapping between the third on-command signal and the second on-command signal is a turn-off time of the second semiconductor element or longer, but is twice the turn-off time or shorter.

* * * * *